(12) United States Patent
Ueda et al.

(10) Patent No.: US 8,087,296 B2
(45) Date of Patent: Jan. 3, 2012

(54) ANGULAR VELOCITY SENSOR

(75) Inventors: Shinjiro Ueda, Fukui (JP); Hiroaki Mouri, Fukui (JP); Koichiro Nakashima, Fukui (JP)

(73) Assignee: Panasonic Corporation, Osaka (JP)

( * ) Notice: Subject to any disclaimer, the term of this patent is extended or adjusted under 35 U.S.C. 154(b) by 728 days.

(21) Appl. No.: 12/162,417

(22) PCT Filed: Mar. 7, 2007

(86) PCT No.: PCT/JP2007/054428
§ 371 (c)(1),
(2), (4) Date: Jul. 28, 2008

(87) PCT Pub. No.: WO2007/105559
PCT Pub. Date: Sep. 20, 2007

(65) Prior Publication Data
US 2009/0165557 A1    Jul. 2, 2009

(30) Foreign Application Priority Data

| Mar. 15, 2006 | (JP) | 2006-070601 |
| Mar. 15, 2006 | (JP) | 2006-070602 |
| Mar. 15, 2006 | (JP) | 2006-070603 |
| Mar. 15, 2006 | (JP) | 2006-070604 |
| Mar. 15, 2006 | (JP) | 2006-070605 |
| Mar. 15, 2006 | (JP) | 2006-070606 |

(51) Int. Cl.
*G01C 19/56* (2006.01)

(52) U.S. Cl. ................. 73/504.16; 73/504.12
(58) Field of Classification Search .......... 73/493, 73/504.12, 504.16
See application file for complete search history.

(56) References Cited

U.S. PATENT DOCUMENTS

| 5,373,722 A | 12/1994 | Spies et al. |
| 5,457,982 A | 10/1995 | Spies et al. |
| 6,083,577 A | 7/2000 | Nakagawa et al. |
| 6,250,158 B1* | 6/2001 | Stewart ............. 73/504.14 |
| 6,748,807 B2* | 6/2004 | Yoshiuchi et al. ......... 73/493 |
| 2003/0210102 A1 | 11/2003 | Harima et al. |
| 2005/0199062 A1* | 9/2005 | Ookoshi ............. 73/504.16 |

FOREIGN PATENT DOCUMENTS

| JP | 5-92635 | 12/1993 |
| JP | 8-170918 | 7/1996 |
| JP | 8-240611 | 9/1996 |
| JP | 10-78454 | 3/1998 |
| JP | 10-135771 | 5/1998 |
| JP | 11-230758 | 8/1999 |
| JP | 11-325908 | 11/1999 |

(Continued)

OTHER PUBLICATIONS

English translation of JP 2004-235719, Aug. 2004.

(Continued)

*Primary Examiner* — John Chapman, Jr.
(74) *Attorney, Agent, or Firm* — Wenderoth, Lind & Ponack, L.L.P.

(57) ABSTRACT

An angular velocity sensor includes a substrate having an upper surface having a first recess provided therein, an electronic component mounted in the first recess, and a vibration element mounted onto the upper surface of the substrate. The first vibration element has a portion located directly above the electronic component. This angular velocity sensor has a small size.

12 Claims, 14 Drawing Sheets

FOREIGN PATENT DOCUMENTS

| | | |
|---|---|---|
| JP | 2000-074674 | 3/2000 |
| JP | 2001-074466 | 3/2001 |
| JP | 2003-264429 | 9/2003 |
| JP | 2004-172752 | 6/2004 |
| JP | 2004-235719 | 8/2004 |
| JP | 2004-301786 | 10/2004 |
| JP | 2005-072050 | 3/2005 |
| JP | 2005-221437 | 8/2005 |
| JP | 2005-227110 | 8/2005 |
| JP | 2006-284551 | 10/2006 |
| JP | 2006-300577 | 11/2006 |
| WO | 98/02783 | 1/1998 |

OTHER PUBLICATIONS

English translation of JP 2005-072050, Mar. 2005.

International Search Report issued May 1, 2007 in the International (PCT) Application of which the present application is the U.S. National Stage.

* cited by examiner

ANGULAR VELOCITY SENSOR

TECHNICAL FIELD

The present invention relates to an angular velocity sensor useable for electronic devices, such as stabilizing prevention systems for digital still cameras, or vehicle systems, such as car navigation systems, and to a method for manufacturing the sensor.

BACKGROUND ART

JP11-325908A discloses a conventional angular velocity sensor including a vibration element and an integrated circuit (IC) which are mounted on a single surface of a substrate, and further including case for sealing the vibration element and the IC. This structure prevents the angular velocity sensor from have a small size. JP11-325908A does not disclose any method of mounting the vibration element and the IC. Chip components are usually mounted and fixed onto the substrate with a solder. The vibration element and the IC may be mounted with a thermosetting resin. The reflow of the solder connection of the chip components and the curing of the thermosetting resin are performed under temperature profiles different from each other. More specifically, the reflow is performed at a relatively high temperature for a short duration, whereas the heat-curing of the resin is performed at a relatively low temperature for a long duration. Thus, it is difficult to use both the different temperature profiles together.

JP5-92635U discloses another angular velocity sensor including two vibration elements having detection axes perpendicular to each other.

JP2000-74674A discloses a method for manufacturing an angular velocity sensor, in which a vibration element is tested in characteristics every time. This method prevents the angular velocity sensor from being manufactured efficiently.

JP8-170918A discloses an angular velocity sensor used for a stabilizing system. This angular velocity sensor includes a vibration element which is sealed in a case, and is manufactured by complicated processes.

SUMMARY OF THE INVENTION

An angular velocity sensor includes a substrate having an upper surface having a first recess provided therein, an electronic component mounted in the first recess, and a vibration element mounted onto the upper surface of the substrate. The first vibration element has a portion located directly above the electronic component.

This angular velocity sensor has a small size.

REFERENCE NUMERALS

1 Substrate
2 Recess (First Recess)
3 IC (Electronic Component)
3C Bump Terminal (Terminal)
4A Leg
4B Base
5A Leg
5B Base
6 Chip Component
7 Case
7C Lower End of Case
7D Portion of Lower End of Case (First Portion)
7E Portion of Lower End of Case (Second Portion)
10 Recess (Second Recess)
11 Recess (Second Recess)
12 Element Electrode (Electrode)
13A Component Electrode (Electrode)
13B Component Electrode
15 Wire
20 Sheet Substrate
23 Adhesive (Second Adhesive)
24 Adhesive (First Adhesive)
25 Conductive Adhesive
26 Rotation Axis
51 Electrode
52 Adhesive
54 Vibration Element (First Vibration Element)
55 Vibration Element (Second Vibration Element)
125 Conductive Adhesive
1001 Angular Velocity Sensor

DETAILED DESCRIPTION OF PREFERRED EMBODIMENTS

Exemplary Embodiment 1

Figure 1:
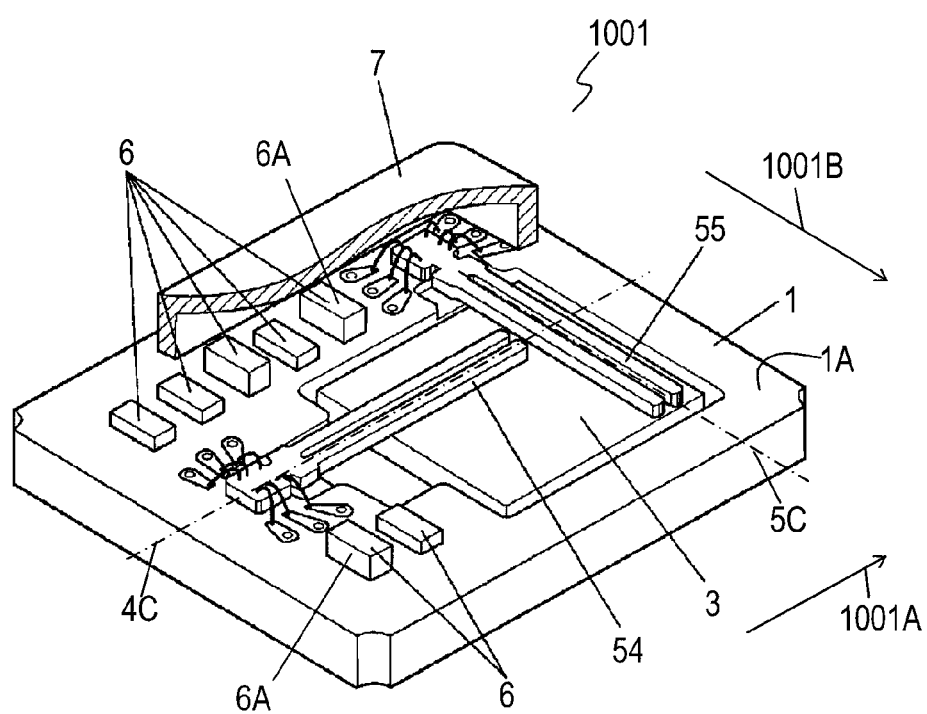
FIG. 1 is a cut-away perspective view of an angular velocity sensor according to Exemplary Embodiment 1 of the present invention.
Figure 2:
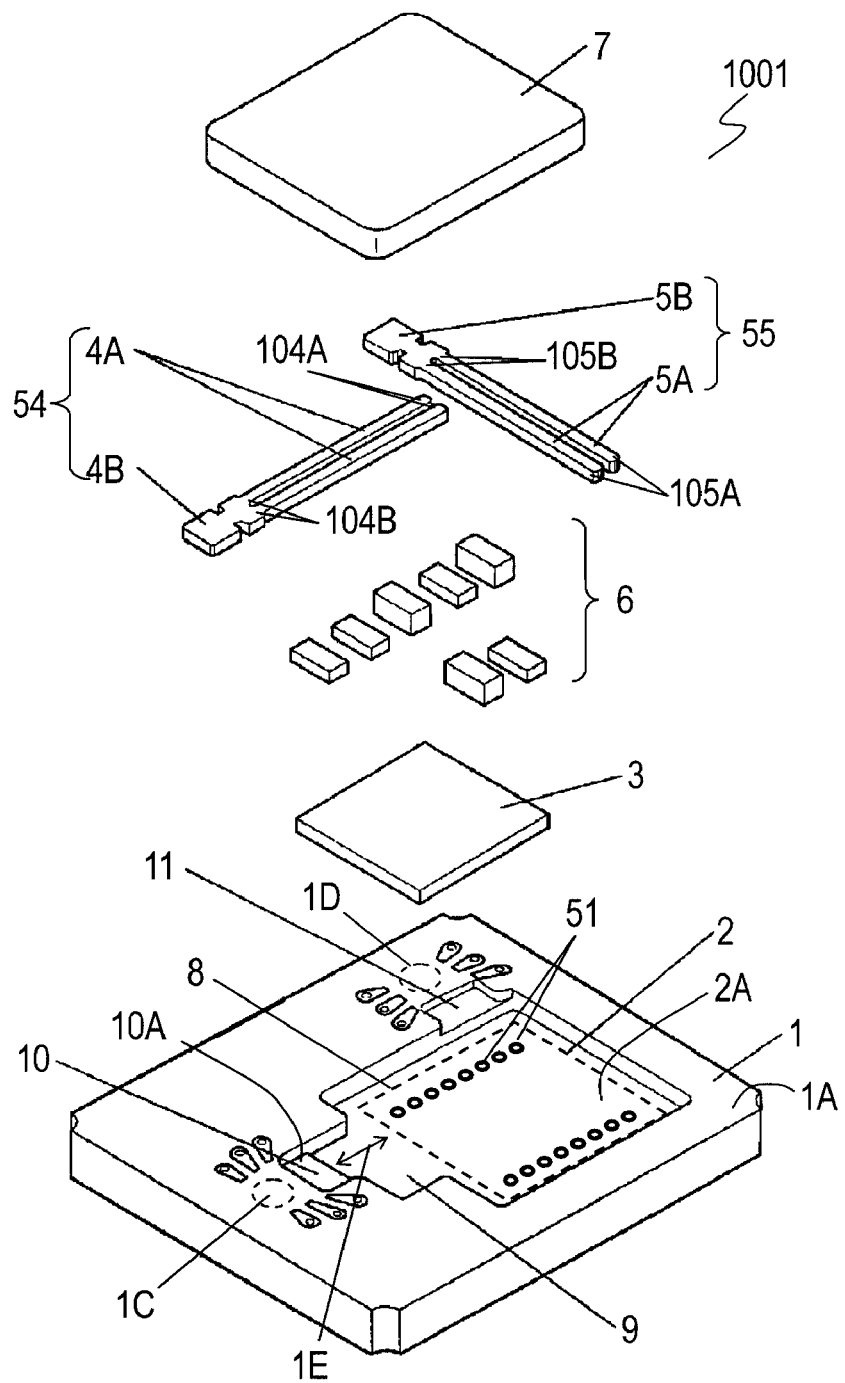
FIG. 2 is an exploded perspective view of the angular velocity sensor according to Embodiment 1.
Figure 3:
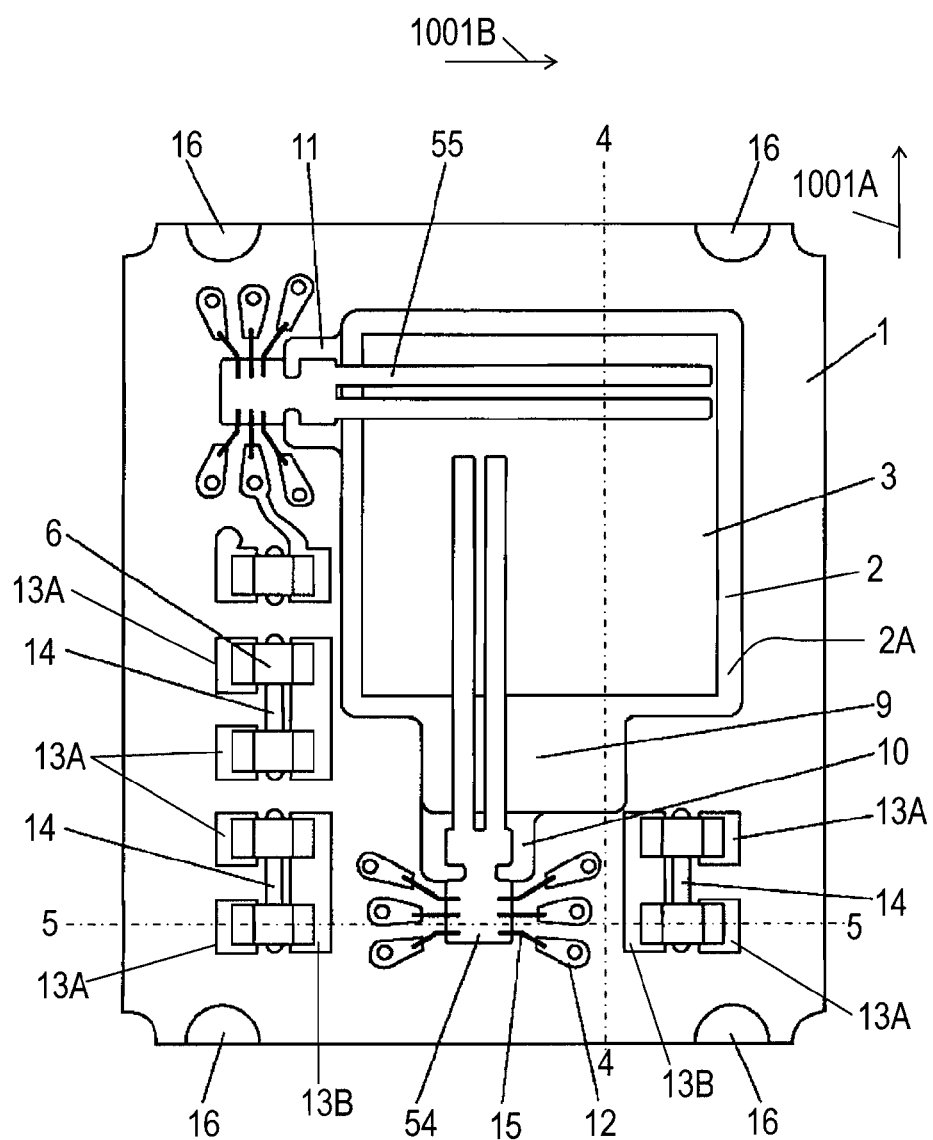
FIG. 3 is a plan view of the angular velocity sensor according to Embodiment 1.
Figure 4:
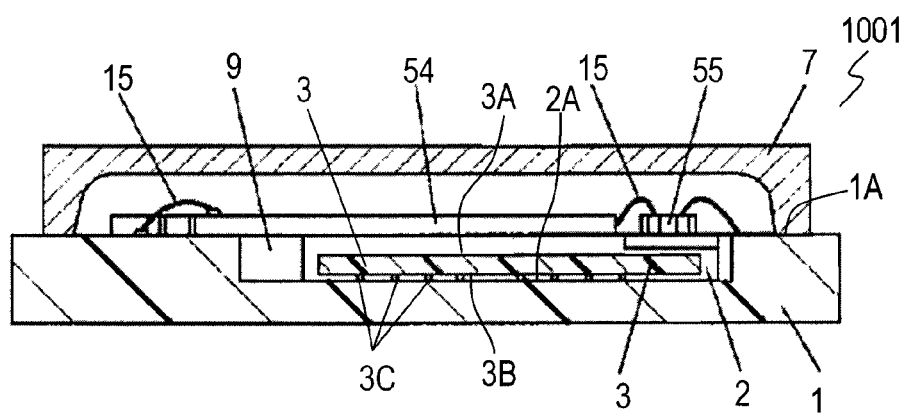
FIG. 4 is a sectional view of the angular velocity sensor at line 4-4 shown in FIG. 3.
Figure 5:
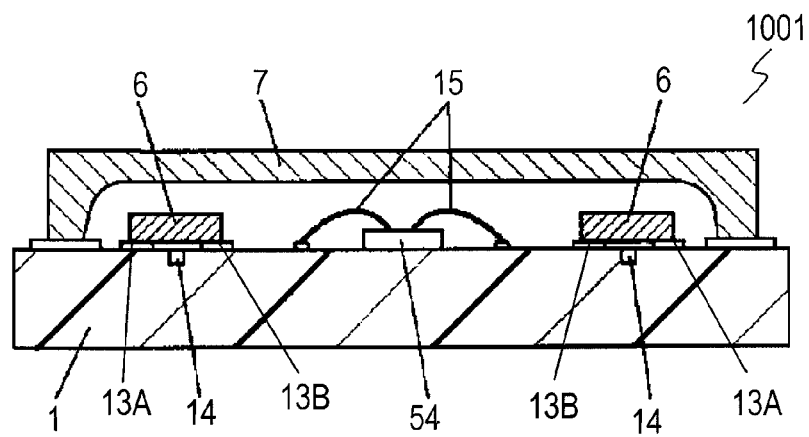
FIG. 5 is a sectional view of the angular velocity sensor at line 5-5 shown in FIG. 3.

FIGS. 1, 2, and 3 are a perspective view, an exploded perspective view, and a plan view of angular velocity sensor 1001 according to of Exemplary Embodiment 1 of the present invention, respectively. FIGS. 4 and 5 are sectional views of angular velocity sensor 1001 at line 4-4 and line 5-5 shown in FIG. 3, respectively.

Angular velocity sensor 1001 includes substrate 1 formed by laminating and sintering ceramic sheets. Substrate 1 has upper surface 1A having recess 2 provided therein. Recess 2 has bottom 2A. Integrated circuit (IC) 3 as an electronic component is mounted onto bottom 2A in recess 2. Base 4B of vibration element 54 is joined to joint portion 1C of upper surface 1A of substrate 1. Vibration element 54 has a tuning fork shape including two legs 4A extending in parallel to each other and base 4B. Each of legs 54 has open end 104A and end 104B. Legs 54 can vibrate and extend in direction 1001A. Base 4B fixes end 104B of each of legs 54. Joint portion 1D of upper surface 1A of substrate 1 is joined to base 5B of vibration element 55. Vibration element 55 has a tuning fork shape including two legs 5A extending in parallel to each other and base 5B. Each of two legs 5A has open end 105A and end 105B, and can vibrate. Base 5B fixes end 105B of each of two legs 5A. Two legs 5A extend in direction 1001B perpendicular to direction 1001A. Vibration elements 54 and 55 are connected electrically to IC 3. IC 3 supplies driving signals to vibration elements 54 and 55 to drive the elements. Vibration element 54 has detection axis 4C extending in direction 1001A between two legs 4A, and sends, to IC 3, a detection signal corresponding to an angular velocity at which vibration element 54 rotates about detection axis 4C. Vibration element 55 has detection axis 5C extending in direction 1001B between two legs 5A, and sends, to IC 3, a detection signal corresponding to an angular velocity at which vibration element 55 rotates about detection axis 5C. IC 3 performs a predetermined signal processing to the detection signals received from vibration elements 54 and 55. Chip components 6 are mounted onto upper surface 1A of substrate 1 to form an electric circuit together with IC 3. Chip components 6 include chip resistor 6A. Case 7 is mounted onto upper surface 1A of substrate 1 to cover recess 2, IC 3, vibration elements 54 and 55, and chip components 6.

IC 3 is mounted onto mounting portion 8 of bottom 2A of recess 2 such that IC 3 does not protrude from upper surface 1A of substrate 1. IC 3 has upper surface 3A and lower surface 3B opposite to upper surface 3B. Upper surface 3A of IC 3 is positioned under upper surface 1A of substrate 1. In other words, recess 2 has depth 2B larger than the distance from bottom 2A of recess 2 to upper surface 3A of IC 3. Lower surface 3B of IC 3 faces bottom 2A of recess 2, i.e., mounting portion 8. Bump terminals 3C are provided on lower surface 3B of IC 3. Electrodes 51 connected to bump terminals 3C of IC 3 are provided on mounting portion 8 of substrate 1. Injection portion 9 which is a portion of bottom 2A of recess 2 is adjacent to mounting portion 8, and is exposed even while IC 3 is mounted onto mounting portion 8. Injection portion 9 provides a space to which a nozzle is inserted for injecting adhesive to join IC 3 to substrate 1. Upper surface 1A of substrate 1 has recesses 10 and 11 provided therein. Recesses 10 and 11 communicate with recess 2, and are shallower than recess 2. Recess 10 is located beneath vibration element 54 and between joint portion 1C and recess 2. Recess 11 is located beneath vibration element 55 and between joint portion 1D and recess 2, and communicates directly with recess 2.

Element electrodes 12 are provide on upper surface 1A of substrate 1, and connected electrically with vibration elements 54 and 55 via wires 15. Component electrodes 13A and 13B are provided on substrate 1 and connected with chip components 6. Groove 14 is provided in upper surface 1A of substrate 1 and between component electrodes 13A and 13B. Positioning mark 16 is provided on upper surface 1A of substrate 1 to position substrate 1 during the manufacturing of angular velocity sensor 1001.

Figure 6:
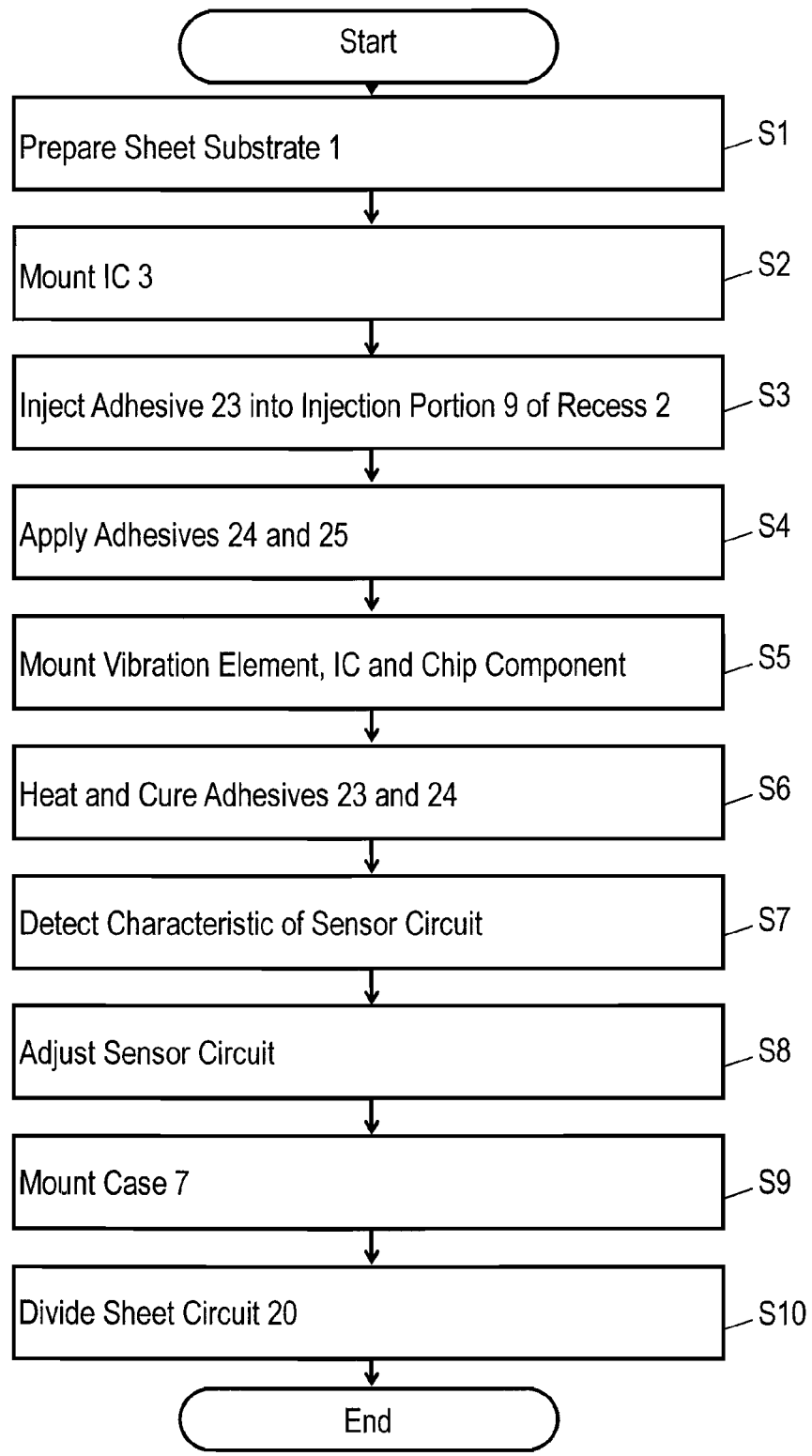
FIG. 6 is a flowchart illustrating processes for manufacturing the angular velocity sensor according to Embodiment 1.

A method for manufacturing angular velocity sensor 1001 will be described below. FIG. 6 is a flowchart illustrating processes for manufacturing angular velocity sensor 1001.

Figure 7:
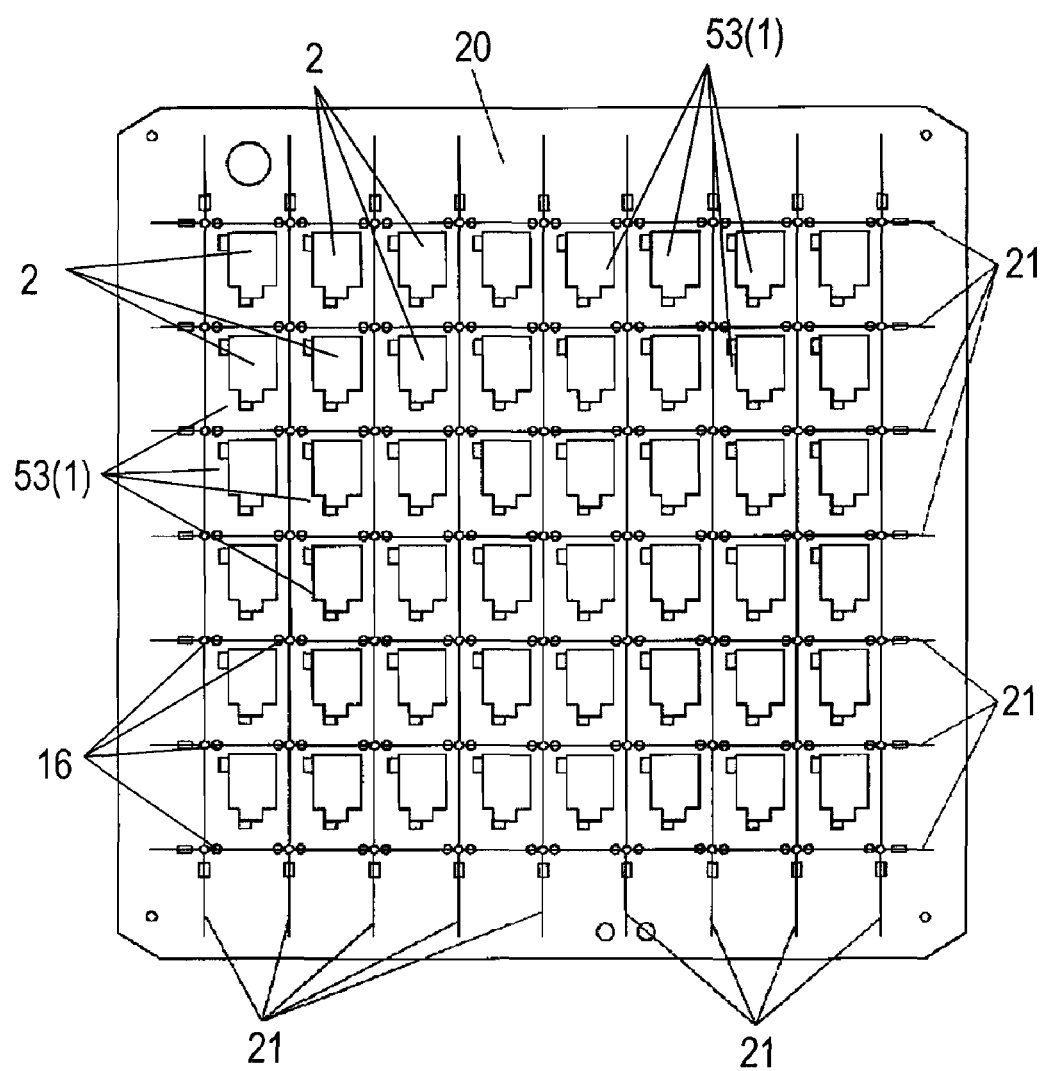
FIG. 7 is a plan view of a sheet substrate used for manufacturing the angular velocity sensor according to Embodiment 1.

FIG. 7 is a plan view of sheet substrate 20 used for manufacturing angular velocity sensor 1001. First, sheet substrate 20 is prepared by laminating and sintering ceramic sheets (Step S1 of FIG. 6). Sheet substrate 20 includes chip substrates 53 connected to each other. Each of chip substrates 53 is arranged to provide substrate 1. Sheet substrate 20 has plural dividing grooves 21 extending between chip substrates 53 (substrates 1). Sheet substrate 20 is divided into chip substrates 53 along dividing grooves 21 to provide individual substrates 1.

Figure 8:
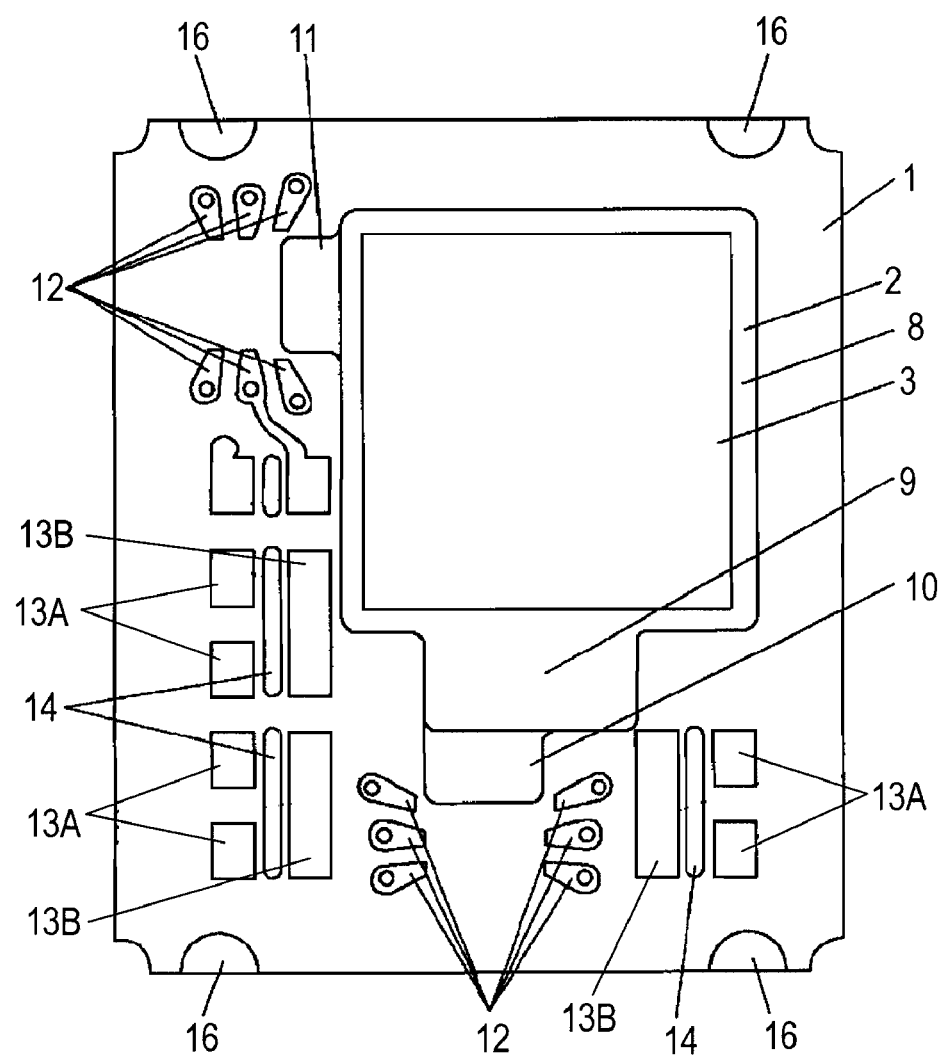
FIG. 8 is a plan view illustrating processes for manufacturing the angular velocity sensor according to Embodiment 1.

FIG. 8 is a plan view of substrate 1 having IC 3 mounted thereon. FIG. 8 does not entirely show sheet substrate 20, but does show only a portion of sheet substrate 20 which constitutes one angular velocity sensor 1001. IC 3 is mounted on mounting portion 8 in recess 2 of each substrate 1 of sheet substrate 20 (Step S2 of FIG. 6). Bump terminals 3C on lower surface 3B of IC 3 are pressed against electrodes 51 provided on each substrate 1, and melted with ultrasonic waves to be joined with electrodes 51.

Figure 9:
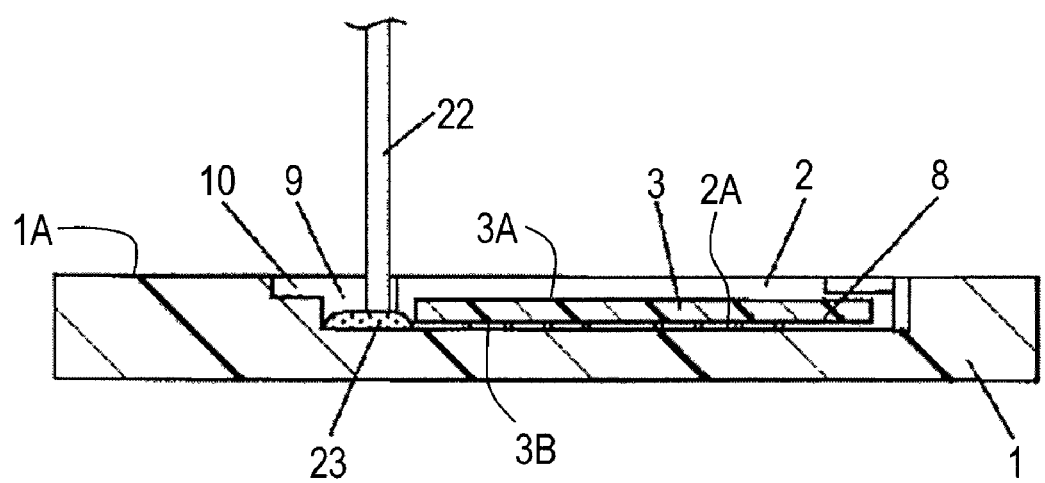
FIG. 9 is a sectional view illustrating processes for manufacturing the angular velocity sensor according to Embodiment 1.

FIG. 9 is a sectional view of substrate 1 having IC 3 mounted thereon. FIG. 9 does not entirely show sheet substrate 20, but does show only a portion of sheet substrate 20 which constitutes one angular velocity sensor 1001. Nozzle 22 is inserted in recess 2 from directly above injection portion 9 which a portion of bottom 2A of recess 2, and injects adhesive 23 to injection portion 9 (Step S3 of FIG. 6). Adhesive 23 injected from nozzle 22 flows from injection portion 9 into a gap between lower surface 3B of IC 3 and bottom 2A of recess 2. Adhesive 23 may employ an underfill material, and more specifically, may be a thermosetting resin, such as an epoxy-based resin.

Figure 10:
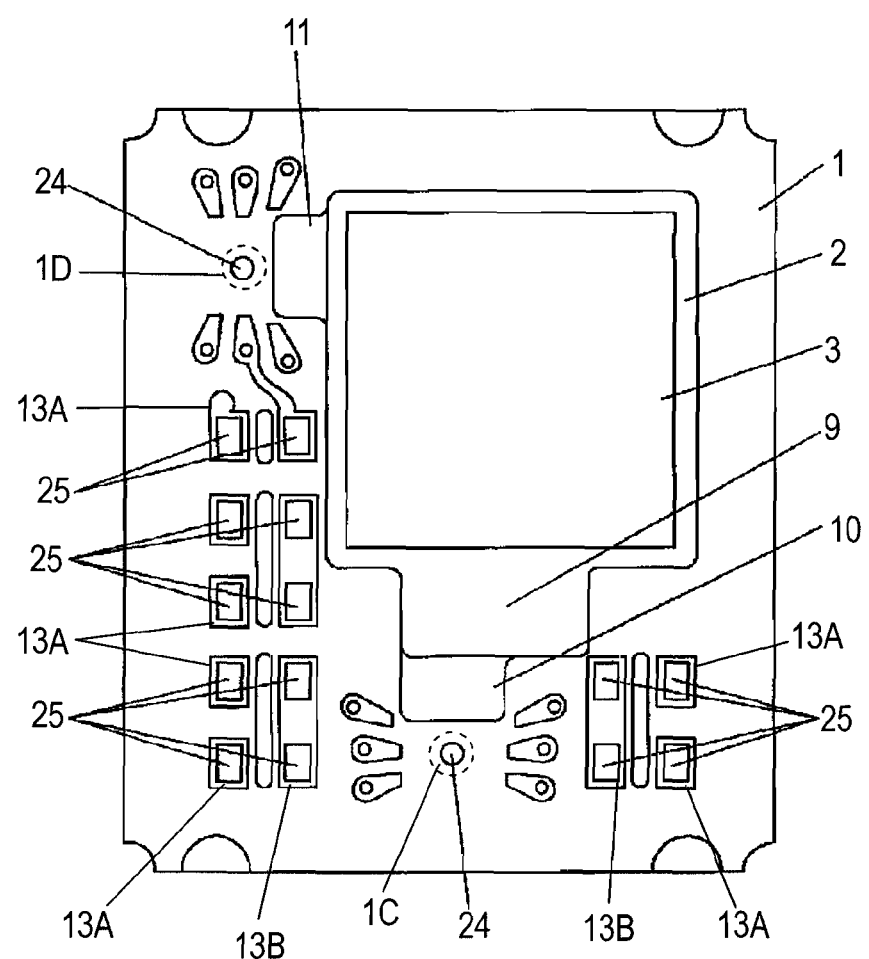
FIG. 10 is a plan view illustrating processes for manufacturing the angular velocity sensor according to Embodiment 1.

FIG. 10 is a plan view of substrate 1 having adhesive 24 and conductive adhesive 25 applied thereto. FIG. 10 does not entirely show sheet substrate 20, but does show only a portion of sheet substrate 20 which constitutes one angular velocity sensor 1001. Adhesive 24 is applied to joint portions 1C and 1D to which vibration elements 54 and 55 are joined on sheet substrate 20, respectively (Step S4 of FIG. 6). Conductive adhesive 25 is applied to component electrodes 13A and 13B on upper surface 1A of each substrate 1 (sheet substrate 20). Adhesive 24 may employ an epoxy-based thermosetting resin. Conductive adhesive 25 may employ a conductive thermosetting resin paste containing silver and resin.

Figure 11:
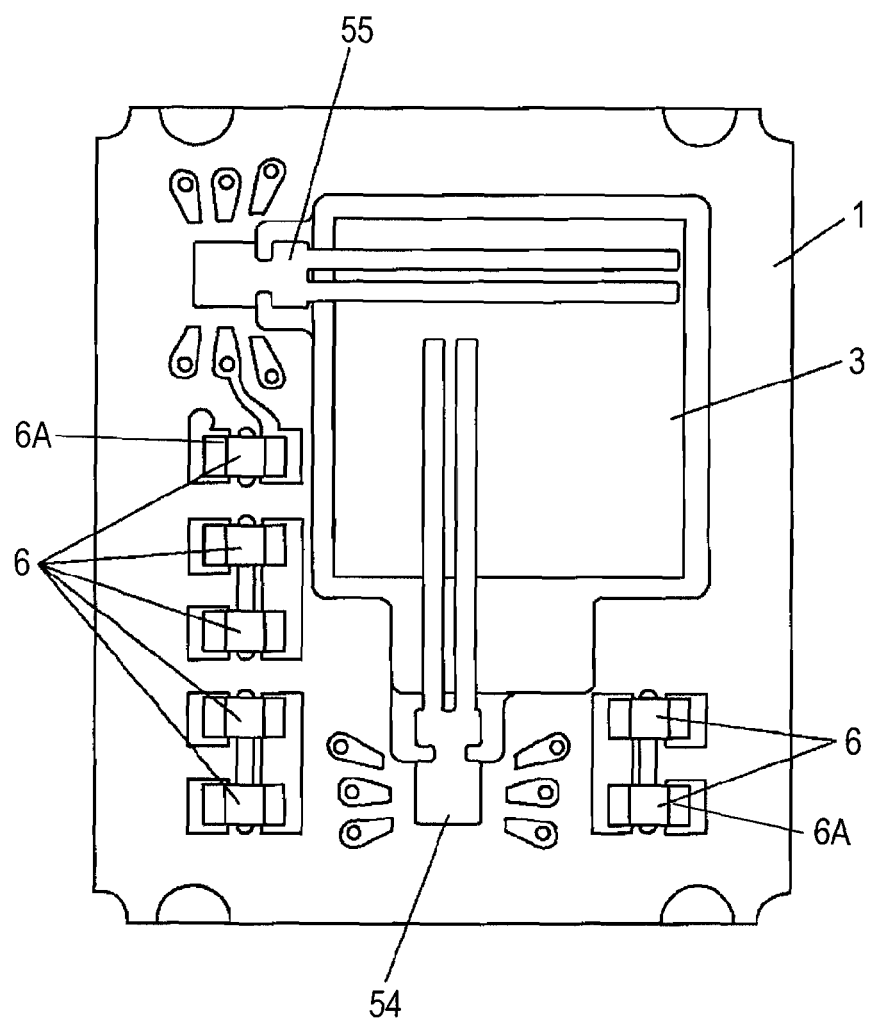
FIG. 11 is a plan view illustrating processes for manufacturing the angular velocity sensor according to Embodiment 1.

FIG. 11 is a plan view of substrate 1 (Sheet substrate 20) having vibration elements 54 and 55 and chip components 6 mounted thereon. FIG. 11 does not entirely show sheet substrate 20, but does show only a portion of sheet substrate 20 which constitutes one angular velocity sensor 1001. Vibration elements 54 and 55 are joined to joint portions 1C and 1D on each substrate 1 (sheet substrate 20) with adhesive 24 (FIG. 10), respectively (Step S5 of FIG. 6). Chip components 6 are joined to component electrodes 13A and 13B with conductive adhesive 25 (Step S5 of FIG. 6).

After vibration elements 54 and 55 and chip components 6 are joined to upper surface 1A of each substrate 1 (sheet substrate 20) at Step S5, sheet substrate 20 is heated to heat adhesives 23 and 24 and conductive adhesive 25 so as to heat-cure adhesives 23, 24, and 25 simultaneously (Step S6 of FIG. 6). In this heat-curing, sheet substrate 20 is heated at a temperature not lower than a temperature at which adhesives 23 and 24 and conductive adhesive 25 are cured. According to the embodiment, sheet substrate 20 is heated at 150° C. for 90 to 120 minutes depending on the composition of the adhesives.

Then, vibration elements 54 and 55 are bonded to element electrodes 12 on upper surface 1A of each substrate 1 (sheet substrate 20) via wires 15 by wire bonding, thereby providing a sensor circuit including vibration elements 54 and 55, chip components 6, and IC 3. The wire bonding connects vibration elements 54 and 55 electrically to element electrodes 12 reliably even if vibration element 54 or 55 deviates from a predetermined position during the joining to substrate 1.

Figure 12:
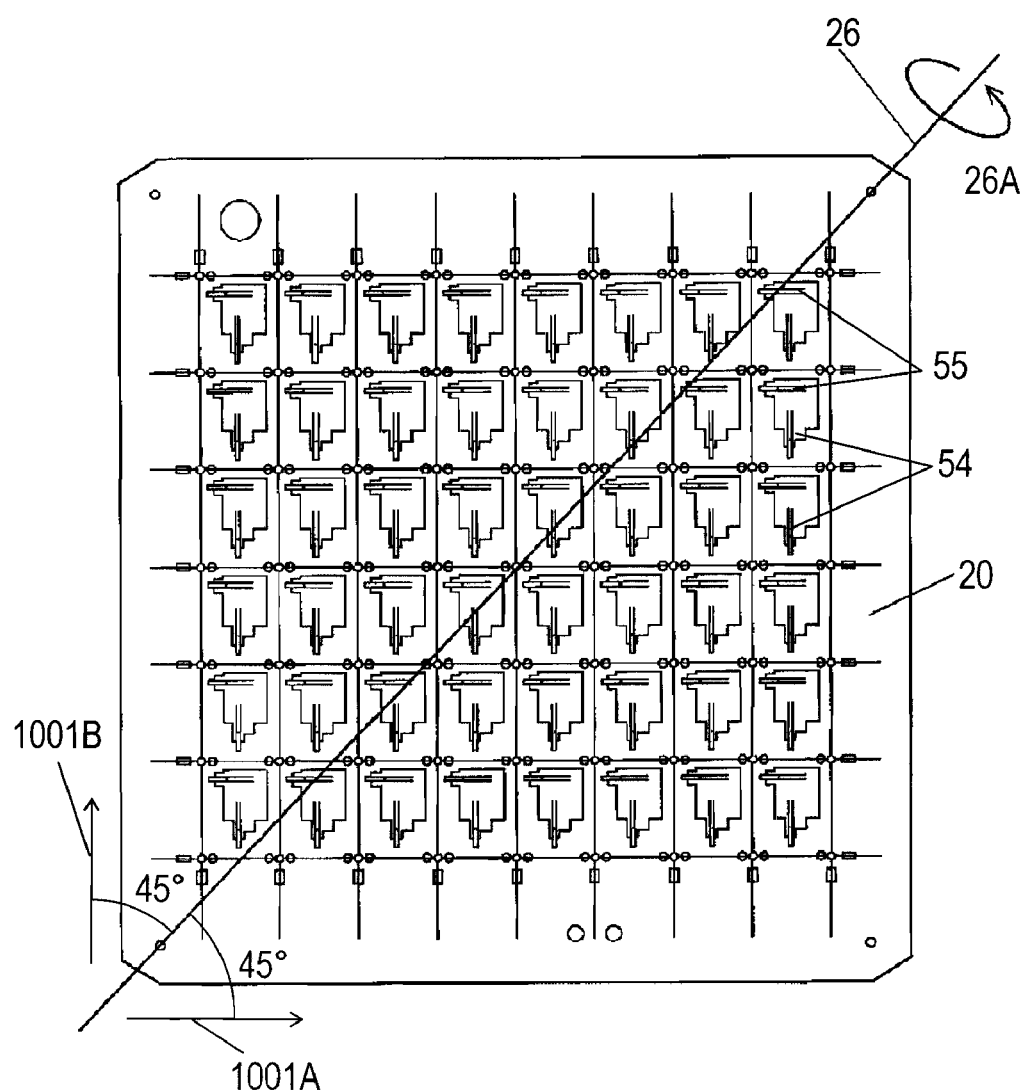
FIG. 12 is a plan view illustrating processes for manufacturing the angular velocity sensor according to Embodiment 1.

FIG. 12 is a plan view of sheet substrate 20 having vibration elements 54 and 55 and chip components 6 mounted thereon and connected thereto. Sheet substrate 20 is rotated about rotation axis 26 so as to apply angular velocity 26A to vibration elements 54 and 55 about rotation axis 26, thereby detecting characteristics of signals output from angular velocity sensor 1001, i.e., the sensor circuit corresponding to the angular velocity (Step S7 of FIG. 6). Rotation axis 26 is angled by 45 degrees with respect to detection axis 4C of vibration element 54 (FIG. 1), i.e., with respect to direction 1001A, and is angled by 45 degrees with respect to detection axis 5C of vibration element 55 (FIG. 1), i.e., with respect to direction 1001B. When angular velocity 26A is applied about rotation axis 26, vibration elements 54 and 55 output signals having values several times the values provided by multiplying the reciprocal of the square root of 2 with the values of signals output from elements 54 and 55 having angular velocities having the same magnitude as angular velocity 26A about detection axes 4C or 5C, respectively. Thus, the values of the signals output from vibration elements 54 and 55 having angular velocity 26A applied thereto about rotation axis 26 are multiplied by the square root of 2, thereby calculating the values of the signals output from vibration elements 54 and 55 having angular velocities having the same magnitude as angular velocity 26A about detection axes 4C and 5C, respectively. In other words, the characteristics of the signals corresponding to the angular velocity applied to angular velocity sensor 1001 including two vibration elements 54 and 55 can be detected by rotating sheet substrate 2 about rotation axis 26 to apply angular velocity 26A to vibration elements 54 and 55. Sheet 20 is rotated at various angular velocities 26A, and the values of the signals output from vibration elements 54 and 55 corresponding to angular velocities 26A are stored in a storage medium, such as a memory.

The sensor circuit of angular velocity sensor 1001 is adjusted so that the values of the signals which are output from vibration elements 54 and 55 and stored in the storage medium are within a predetermined range (Step S8 of FIG. 6). At Step S8, zero points of the values of the signals output from vibration elements 54 and 55 are adjusted. More specifically, chip resistors 6A are trimmed with laser to change their resistances based on the stored values.

After the sensor circuit of angular velocity sensor 1001 is adjusted at Step S8, case 7 is mounted to each of substrates 1 of sheet substrate 20 (Step S9 of FIG. 6). Then, sheet substrate 20 is divided into individual substrates 1 along dividing grooves 21 (Step S10 of FIG. 6) to provide angular velocity sensors 1001 each including two detection axes 4C and 5C extending in directions 1001A and 1001B, respectively.

Portions (legs 4A and 5A) of vibration elements 54 and 55 are located directly above upper surface 3A of IC 3, reducing the area of substrate 1. Bump terminals 3C on lower surface 3B of IC 3 are connected directly to electrodes 51 of substrate 1, thereby allowing upper surface 3A to have no wire or no terminal for connecting to IC 3. This structure allows the portions of vibration elements 54 and 55 to be located directly above IC 3. In angular velocity sensor 1001 including two vibration elements 54 and 55 having detection axes 4C and 5C perpendicular to each other, vibration elements 54 and 55 cross IC 3 longitudinally and laterally. Therefore, if IC 3 is connected via wires, at least one of vibration elements 54 and 55 may contact with the wires. Angular velocity sensor 1001 according to Embodiment 1 has no wire connected to IC 3, which is provided on upper surface 3A, and allows the portions of vibration elements 54 and 55 to be located directly above upper surface 3A of IC 3, thus having a small size.

Legs 4A and 5A of vibration elements 54 and 55 are located directly above recess 2, and upper surface 3A of IC 3 is located under upper surface 1A of substrate 1, so that a space is provided beneath legs 4A and 5A. This space prevents legs 4A and 5A from contacting substrate 1 or IC 3 while vibrating, and allows vibration elements 54 and 55 to be joined to upper surface 1A of substrate 1. This structure eliminates a portion protruding from upper surface 1A to be joined to vibration elements 54 and 55, thus providing angular velocity sensor 1001 with a thin profile.

Bottom 2A of recess 2 has mounting portion 8 having IC 3 mounted thereon and injection portion 9 communicating with mounting portion 8. Nozzle 22 to inject adhesive 23 is inserted to injection portion 9, and puts adhesive 23 securely between IC 3 and mounting portion 8 of bottom 2A of recess 2, thereby adhering IC 3 onto bottom 2A securely. Since adhesive 23 can hardly be injected between IC 3 and an inner wall of recess 2, injection portion 9 facilitates adhesive 23 to be put between bottom 2A and lower surface 3B of IC 3.

Upper surface 1A has recess 10 provided therein. Recess 10 is shallower than mounting portion 8 and injection portion 9, i.e., than bottom 2A of recess 2, and communicates directly with injection portion 9. Recess 10 is located away from mounting portion 8 by distance 1E. Recess 10 increases a creeping distance from injection portion 9 to upper surface 1A of substrate 1, accordingly preventing adhesive 23 from overflowing from recess 2 onto upper surface 1A of substrate 1. Recess 10 is shallower than injection portion 9 (bottom 2A of recess 2), and may have electric wiring on bottom 10A.

Recess 10 communicates with recess 2 of substrate 1 and is located between recess 2 and joint portion 1C of substrate 1 joined to vibration element 54, and therefore, recess 10 is closest to joint portion 1C in recess 2. Recess 11 communicates with recess 2 of substrate 1 and is located between recess 2 and joint portion 1D of substrate 1 joined to vibration element 55, and therefore, recess 11 is closest to joint portion 1D in recess 2. This structure allows creeping distances to joint portions 1C and 1D to be large enough to prevent adhesive 23 from contacting vibration elements 54 and 55, thereby preventing adhesive 23 from influencing the vibration of vibration elements 54 and 55.

At Steps S7 and S8 of FIG. 6, an angular velocity is applied to sheet substrate 20 having substrates 1 so as to detect the characteristics of the sensor circuits including angular velocity sensors 1001. Then, the characteristics of the sensor circuits including angular velocity sensors 1001 are adjusted to reduce variations in the characteristics of angular velocity sensors 1001. Then, sheet substrate 20 is divided into individual substrates 1 (angular velocity sensors 1001). This process can manufacture angular velocity sensors 1001 more efficiently than a process in which the characteristics of angular velocity sensors 1001 are detected and adjusted after sheet substrate 20 is divided into individual angular velocity sensors 1001.

Case 7 is mounted to each substrate 1 of sheet substrate 20 at Step S9 to cover vibration elements 54 and 55 before sheet substrate 20 is divided at Step S10. Case 7 may have burrs when sheet substrate 20 is divided into individual substrates 1. Case 7 reliably prevents the burrs from contacting vibration element 54 or 55, thus protecting vibration elements 54 and 55 securely at Step S10. Case 7 also covers IC 3, and can protect IC 3 at Step S10.

Figure 13:
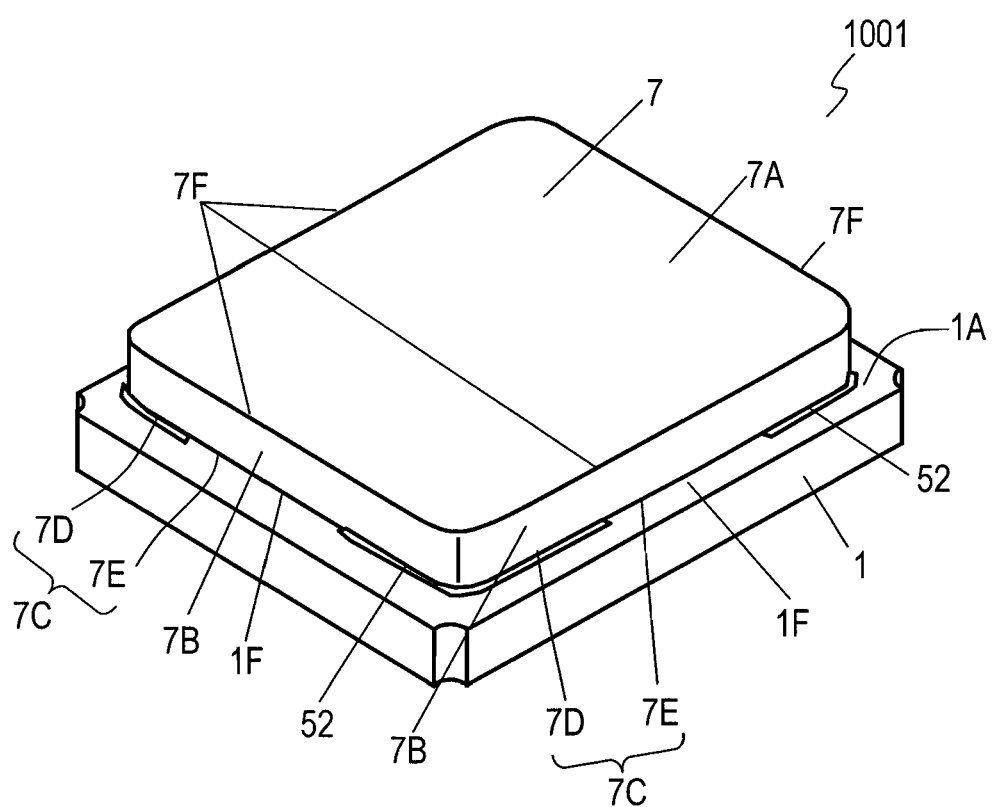
FIG. 13 is a perspective view of the angular velocity sensor according to Embodiment 1.

FIG. 13 is a perspective view of angular velocity sensor 1001. Case 7 includes cover plate 7A and side walls 7B. Cover plate 7A is located directly above vibration elements 54 and 55, recess 2, IC 3, and chip components 6. Side walls 7B extend from outer periphery 7F of cover plate 7A downward towards upper surface 1A of substrate 1. Side walls 7B have lower end 7C facing upper surface 1A of substrate 1. Lower end 7C of case 7 is joined to upper surface 1A of substrate 1 with adhesive 52 at Step S9 of FIG. 6 such that gap 1F is provided in between lower end 7C and upper surface 1A. In other words, lower end 7C of case 7 includes portion 7D having adhesive 52 applied thereto, and portion 7E which does not have adhesive 52 applied thereto. Gap 1F is provided between portion 7E of lower end 7C and upper surface 1A of substrate 1 so that case 7 protects vibration elements 54 and 55. Case 7 is not sealed, thus allowing angular velocity sensor 1001 to be manufactured easily. The space in case 7 accommodating vibration elements 54 and 55 can be vacuum-sealed or filled with gas, such as helium gas, having a small molecular weight. In these cases, case 7 is hermetically sealed on substrate 1 (sheet substrate 20). This structure requires a process for inspecting the air-tightness of the space, making processes for manufacturing the sensor complicated. In the case that zero-point shift does not matter, for example, in the case that angular velocity sensor 1001 is used in a stabilizing system, case 7 may not necessarily be sealed, hence simplifying processes for manufacturing the structure shown in FIG. 13.

Adhesives 23 and 24 for joining IC 3 and vibration elements 54 and 55 to substrate 1 contain thermosetting resin. Conductive adhesive 25 joining chip components 6 to component electrodes 13A and 13B also contains thermosetting resin. Adhesives 23 and 24 and conductive adhesive 25 can be cured simultaneously in a process at Step S6 of FIG. 6, thereby allowing angular velocity sensors 1001 to be manufactured efficiently. The thermosetting resin contained in conductive adhesive 25 has a surface tension smaller than conductive metal adhesive, such as solder, and may protrude from component electrodes 13A and 13B on upper surface 1A of substrate 1. Grooves 14 provided in upper surface 1A of substrate 1 and between component electrodes 13A and 13B increase a creeping distance between component electrodes 13A and 13B, accordingly preventing a short-circuit between the electrodes.

Angular velocity sensor 1001 according to Embodiment 1 includes two vibration elements 54 and 55 having detection axes 4C and 5C perpendicular to each other, but may include only one vibration element.

Sheet substrate 20 is divided into plural angular velocity sensors 1001 according to Embodiment 1, alternatively, a single angular velocity sensor 1001 may be formed from a single substrate 1.

Angular velocity sensor 1001 according to Embodiment 1 is small enough for use in an electronic device, such as a stabilizing system of a digital still camera or a vehicle system, such as a car navigation system.

Exemplary Embodiment 2

Figure 14:
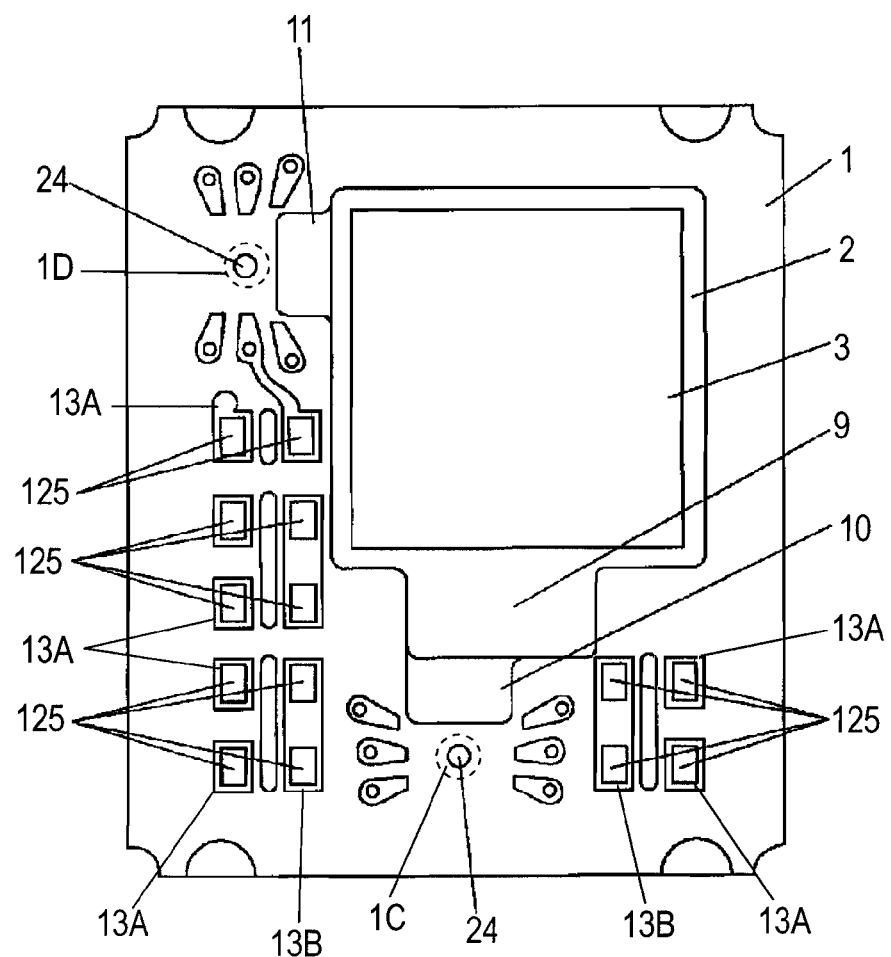
FIG. 14 is a plan view illustrating processes of manufacturing an angular velocity sensor according to Exemplary Embodiment 2 of the invention.

FIG. 14 is a plan view of an angular velocity sensor according to exemplary Embodiment 2 of the present invention for illustrating processes for manufacturing the sensor. In FIG. 14, components identical to those of angular velocity sensor 1001 shown in FIGS. 1 to 5 and 7 to 13 are denoted by the same reference numerals, and their description will be omitted. The angular velocity sensor according to Embodiment 2 includes conductive adhesive 125 instead of conductive adhesive 25 of angular velocity sensor 1001 shown in FIGS. 1 to 5 and 7 to 13. FIG. 14 does not entirely show sheet substrate 20, but does show only a portion of sheet substrate 20 which constitutes one angular velocity sensor.

Figure 15:
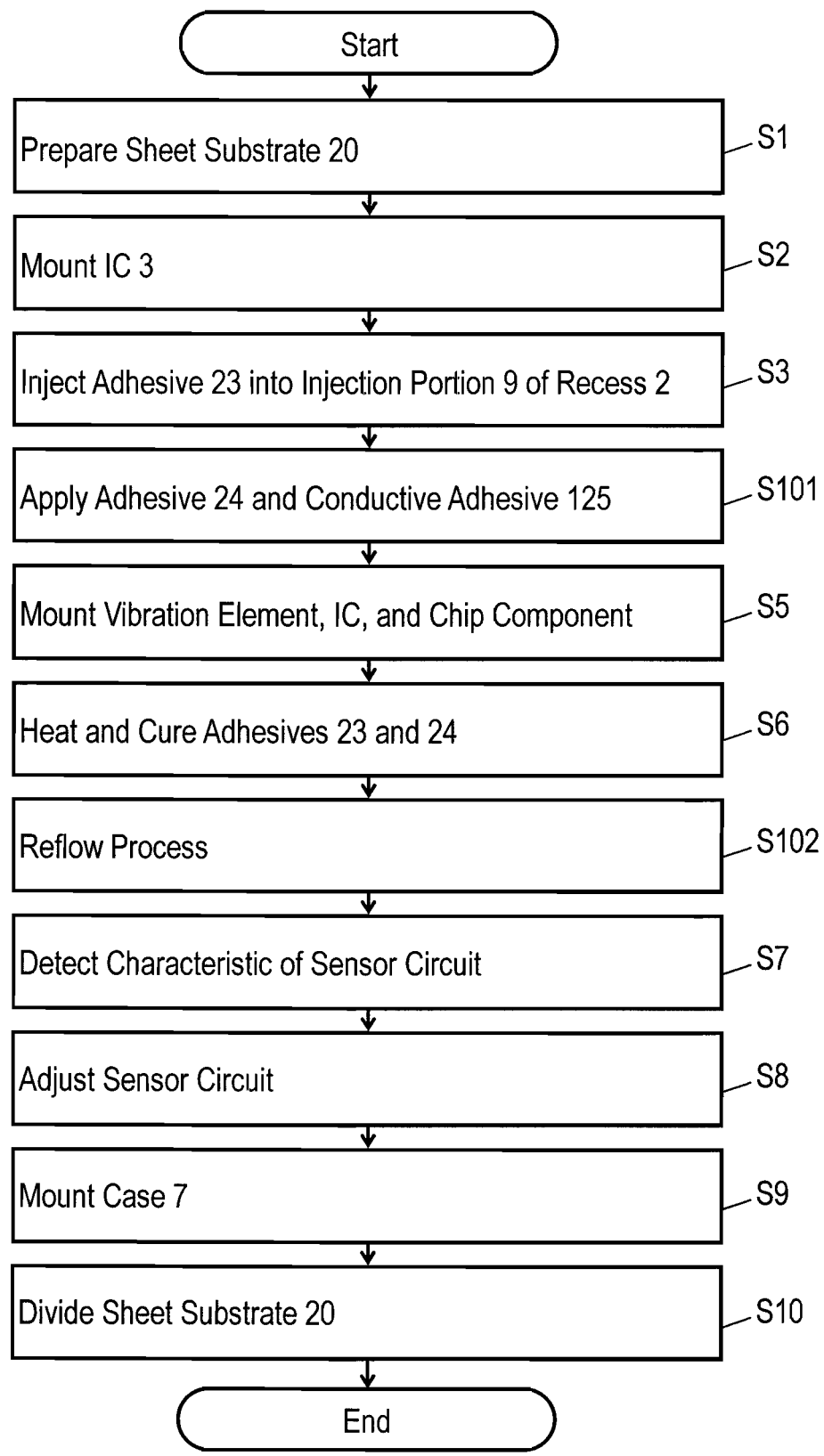
FIG. 15 is a flowchart illustrating processes for manufacturing the angular velocity sensor according to Embodiment 2.

FIG. 15 is a flowchart illustrating processes for manufacturing the angular velocity sensor according to Embodiment 2.

Similarly to the processes of manufacturing angular velocity sensor 1001 according to Embodiment 1 shown in FIG. 6, adhesive 23 is put between IC 3 and bottom 2A of recess 2 of substrate 1 through injection portion 9 of recess 2 at Step S3.

As shown in FIG. 14, adhesive 24 is applied to joint portions 1C and 1D of substrate 20 to be joined to vibration elements 54 and 55, respectively. Conductive adhesive 125 is applied to component electrodes 13A and 13B on upper surface 1A of each substrate 1 (sheet substrate 20) (Step S101 of FIG. 15). Adhesive 24 may be made of epoxy-based thermosetting resin. Conductive adhesive 125 is made of conductive metal adhesive, such as solder, containing metal.

Then, vibration elements 54 and 55 are joined to joint portions 1C and 1D of each substrate 1 (sheet substrate 20) with adhesive 24, respectively (Step S5 of FIG. 15). Chip components 6 are joined to component electrodes 13A and 13B with conductive adhesive 125 (Step S5 of FIG. 15).

After vibration elements 54 and 55 and chip components 6 are joined to upper surface 1A of each substrate 1 (sheet substrate 20) at Step S5, sheet substrate 20 is heated to cure adhesives 23 and 24 (Step S6 of FIG. 15). In this heat curing, sheet substrate 20 is heated at a temperature not lower than a temperature at which adhesives 23 and 24 are cured. According to the embodiment 2, sheet substrate 20 is heated at 150° C. for 90 to 120 minutes depending on the composition of adhesives 23 and 24.

Consecutively after adhesives 23 and 24 are heated and cured at Step S5, a reflow process is performed in which sheet substrate 20 is heated at a temperature higher than the above temperature so as to melt conductive adhesive 125, thereby fixing chip components 6 to component electrodes 13A and 13B (Step S102). At Step S102, sheet substrate 20 is heated at a temperature higher than that at Step S6, for example, at 260° C. just for 5 minutes, which is shorter than the duration at Step S6. Thus, conductive adhesive 125 as the conductive metal adhesive is melted consecutively after adhesives 23 and 24 made of thermosetting resin are cured. This process allows both the resin and the conductive metal adhesive to exhibit adhesion property. In other words, both the heat-curing process and the reflow process can be performed in the same heating process by changing the temperature profiles so as to manufacture the angular velocity sensor according to Embodiment 2 in a simple production process, accordingly increasing energy efficiency for heating.

The reflow process is performed after vibration elements 54 and 55 and IC 3 are jointed, hence preventing vibration elements 54 and 55 and IC 3 from being displaced.

Conductive adhesive 125 as the conductive metal adhesive joins chip components 6 to component electrodes 13A and 13B reliably. Adhesives 23 and 24 made of thermosetting resin are cured by being heated at a lower temperature for a longer duration. In contrast, conductive adhesive 125, the conductive metal adhesive, is melted by being heated at a higher temperature for a shorter duration. The temperature and the heating duration appropriate for the thermosetting resin do not allow the conductive metal adhesive to melt, and hence, does not join chip component 6. The heating temperature and heating duration appropriate for the conductive metal adhesive raise the temperature of substrate 1 before the thermosetting resin is cured. If the temperature of substrate 1 rises excessively, substrate 1 may sag, thereby preventing IC 3 and vibration elements 54 and 55 from being properly joined. At Step S102, sheet substrate 20 is heated at a temperature higher than that at Step S6, for example, at 260° C. just for 5 minutes, which is shorter than that at Step S6. This process allows the thermosetting resin and the conductive metal adhesive to exhibit adhesion property appropriately. Conductive adhesive 125 as the conductive metal adhesive has a surface tension higher than that of conductive adhesive 25 made of the thermosetting resin according to Embodiment 1, hence being located within component electrodes 13A and 13B. This structure can eliminate grooves 14 provided in upper surface 1A of substrate 1 for preventing short-circuits between component electrodes 13A and 13B.

The angular velocity sensor according to Embodiment 2 has a size small enough for use in an electronic device, such as a stabilizing system of a digital still camera, or a vehicle system, such as a car navigation system.

INDUSTRIAL APPLICABILITY

An angular velocity sensor according to the present invention has a size small enough for use in an electronic device or a vehicle.

The invention claimed is:

1. An angular velocity sensor comprising:
a substrate having an upper surface, the upper surface having a first recess provided therein;
an electronic component mounted in the first recess; and
a first vibration element mounted onto the upper surface of the substrate and connected electrically to the electronic component, the first vibration element having a portion located directly above the electronic component,
wherein the upper surface of the substrate has a second recess provided therein, the second recess (i) being located beneath the first vibration element, (ii) being shallower than the first recess, and (iii) communicating with the first recess,
wherein the upper surface of the substrate has a first joint portion joined directly to the first vibration element,
wherein the second recess is located between the first joint portion and the first recess,
wherein the second recess has a bottom, and
wherein the first vibration element directly faces the bottom of the second recess.

2. The angular velocity sensor of claim 1, further comprising an electrode provided on a bottom of the first recess,
wherein the electronic component includes:
a lower surface facing the bottom of the first recess; and
a terminal provided on the lower surface of the electronic component, the terminal being joined to the electrode on the bottom of the first recess.

3. The angular velocity sensor of claim 1,
wherein the first vibration element has a tuning fork shape including (i) a plurality of legs having respective ends and (ii) a base being connected to the respective ends of the plurality of legs, and
wherein the portion of the first vibration element includes at least a portion of the plurality of legs.

4. The angular velocity sensor of claim 1, further comprising a second vibration element mounted onto the substrate,
wherein the first vibration element has a first detection axis for detecting an angular velocity, and
wherein the second vibration element has a second detection axis perpendicular to the first detection axis.

5. The angular velocity sensor of claim 4, wherein the upper surface of the substrate has a third recess provided therein, the third recess (i) being located beneath the second vibration element, (ii) being shallower than the first recess, and (ii) communicating with the first recess.

6. The angular velocity sensor of claim 5,
wherein the upper surface of the substrate has a second joint portion joined to the second vibration element, and
wherein the third recess is located between the second joint portion and the first recess.

7. The angular velocity sensor of claim 4, further comprising:
a case mounted to the upper surface of the substrate, the case covering the first vibration element, the second vibration element, and the first recess; and
an adhesive for joining the case to the upper surface of the substrate such that a gap is provided between the case and the upper surface of the substrate.

8. The angular velocity sensor of claim 4, further comprising:
an electrode provided on the upper surface of the substrate;
a component connected to the electrode;
a conductive adhesive for joining the component to the electrode, the conductive adhesive containing thermosetting resin;
a first adhesive for joining the second vibration element to the upper surface of the substrate, the first adhesive being made of thermosetting resin; and
a second adhesive for joining the electronic component to the first recess, the second adhesive being made of thermosetting resin.

9. The angular velocity sensor of claim 1, further comprising an adhesive for joining the electronic component to the first recess,
wherein the first recess has:
a mounting portion facing the electronic component; and
an injection portion communicating with the mounting portion and exposed to the electronic component, the injection portion allowing the adhesive to inject thereto.

10. The angular velocity sensor of claim 9, wherein the second recess communicates directly with the injection portion of the first recess.

11. The angular velocity sensor of claim 1, further comprising:
a case mounted to the upper surface of the substrate, the case covering the first vibration element and the first recess; and
an adhesive for joining the case to the upper surface of the substrate such that a gap is provided between the upper surface of the substrate and the case.

12. The angular velocity sensor of claim 1, further comprising:
an electrode provided on the upper surface of the substrate;
a component connected to the electrode;
a conductive adhesive for joining the component to the electrode, the conductive adhesive containing thermosetting resin;
a first adhesive for joining the first vibration element to the upper surface of the substrate, the first adhesive being made of thermosetting resin; and
a second adhesive for joining the electronic component to the bottom of the first recess, the second adhesive being made of thermosetting resin.

* * * * *